(12) United States Patent
Xue et al.

(10) Patent No.: US 8,247,288 B2
(45) Date of Patent: Aug. 21, 2012

(54) METHOD OF INTEGRATING A MOSFET WITH A CAPACITOR

(75) Inventors: Yan Xun Xue, Los Gatos, CA (US); Anup Bhalla, Santa Clara, CA (US); Hamza Yilmaz, Saratoga, CA (US); Jun Lu, San Jose, CA (US)

(73) Assignee: Alpha & Omega Semiconductor Inc., Sunnyvale, CA (US)

( * ) Notice: Subject to any disclaimer, the term of this patent is extended or adjusted under 35 U.S.C. 154(b) by 9 days.

(21) Appl. No.: 12/947,717

(22) Filed: Nov. 16, 2010

(65) Prior Publication Data

US 2011/0059593 A1    Mar. 10, 2011

Related U.S. Application Data

(63) Continuation-in-part of application No. 12/693,446, filed on Jan. 26, 2010, which is a continuation-in-part of application No. 12/534,057, filed on Jul. 31, 2009.

(51) Int. Cl.
*H01L 21/8242* (2006.01)

(52) U.S. Cl. ....................................................... 438/239
(58) Field of Classification Search .................... 438/239
See application file for complete search history.

(56) References Cited

U.S. PATENT DOCUMENTS

| | | | | |
|---|---|---|---|---|
| 2008/0047743 | A1* | 2/2008 | Komatsu et al. | 174/260 |
| 2008/0253097 | A1* | 10/2008 | Kawano | 361/766 |
| 2008/0268577 | A1* | 10/2008 | Kagii et al. | 438/124 |

* cited by examiner

*Primary Examiner* — Charles Garber
*Assistant Examiner* — Andre' C Stevenson
(74) *Attorney, Agent, or Firm* — Chein-Hwa Tsao; CH Emily LLC

(57) ABSTRACT

A bypass capacitor is directly integrated on top of a MOSFET chip. The capacitor comprises multi layers of conductive material and dielectric material staking on top of each other with connection vias through dielectric layer for connecting different conductive layers. The method of integrating the bypass capacitor comprises repeating steps of depositing a dielectric layer, forming connection vias through the dielectric layer, depositing a conductive layer and patterning the conductive layer.

23 Claims, 16 Drawing Sheets

METHOD OF INTEGRATING A MOSFET WITH A CAPACITOR

CROSS REFERENCE TO OTHER APPLICATIONS

This application is a continuation-in-part of co-pending U.S. patent application Ser. No. 12/693,446 entitled Structure of Mixed Semiconductor Encapsulation Structure with Multiple Chips and Capacitors filed Jan. 26, 2010, which is incorporated herein by reference for all purposes, and which is a continuation-in-part of co-pending application Ser. No. 12/534,057 entitled MULTI-DIE PACKAGE filed Jul. 31, 2009, which is incorporated herein by reference for all purposes.

BACKGROUND OF THE INVENTION

1. Technical Field

The present invention relates to a metal oxide semiconductor field-effect transistor (MOSFET) for DC-DC converter application, and more specifically, to a metal oxide semiconductor field-effect transistor integrating a bypass capacitor for DC-DC converter application.

2. Description of the Related Art

In the DC-DC converter, a capacitor is often used as a filter capacitor as shown in FIG. 1A, wherein the source $S_1$ of the N-type high side MOSFET1 connects the drain $D_2$ of the N-type low side MOSFET 2, while a capacitor 3 is connected between the drain $D_1$ of the high side MOSFET1 and the source $S_2$ of the low side MOSFET 2. Discrete capacitors have been used for their low cost and high performance. In current trend of miniaturization of electronic components for handheld electronic device application, it is desirable to incorporate a capacitor into a semiconductor chip package. One solution is integrating a capacitor in the DC-DC converter package, in which a separate capacitor and the metal oxide semiconductor field-effect transistors (MOSFET) are simultaneously co-packaged in a package structure through epoxy resin. As the structure shown in the schematic diagram of FIG. 1B, the low side MOSFET and the high side MOSFET stacking one on another with a capacitor sandwiched there between corresponding to the circuit diagram shown in FIG. 1A, wherein the semiconductor chip 10 in FIG. 1B constitutes the high side MOSFET1 in FIG. 1A, while the semiconductor chip 20 in FIG. 1B constitutes the low side MOSFET2 in FIG. 1A. The die size of the high side semiconductor chip 10 is smaller than that of the low side semiconductor chip 20 with the semiconductor chip 10 stacking on the semiconductor chip 20 while the semiconductor chip 20 sticking on metal lead frame 30. The top surface of low side MOSFET chip 20 comprises a low side source metal layer 22 having a low side source bonding area 22*a*, a dielectric layer (not shown) covering substantially the whole low side metal layer 22 except the source bonding area 22*a*. A high side drain metal layer 13 is deposited over the dielectric layer on top of the low side source metal layer 22 separated from the source metal layer 22 by the dielectric layer.

Wherein, a high side gate bonding region 11 of the semiconductor chip 10 is connected to a high side gate pin 11*b* through a bonding wire 11*a*; a high side source bonding region 12 of the semiconductor chip 10 is connected to the lead frame 30 through bonding wires 12*a*; a high side drain (not shown in the figure) at the bottom of the semiconductor chip 10 is stuck onto the high side drain metal layer 13 via conductive silver paste (Epoxy), and meanwhile the high side drain metal layer 13 is connected to high side drain pin 13*b* through bonding wire 13*a*. The high side drain metal layer 13 has larger sizes than the semiconductor chip 10.

Wherein, a low side gate bonding region 21 of the semiconductor chip 20 is connected to a low side gate pin 21*b* via a gate bonding wire 21*a*; the source metal layer 22 of the semiconductor chip 20 is provided with a source bonding region 22*a* for connecting to a source pin 22*c* via bonding wires 22*b*; a low side drain (not shown in the figure) at the bottom of the semiconductor chip 20 is stuck onto the lead frame 30 via conductive silver paste (Epoxy electrically connected with the high side source bonding region 12 of the semiconductor chip 10 through bonding wires 12*a*.

Wherein, the tri-layer structure of the dielectric layer (not shown in the figure) between the high side drain metal layer 13 of the semiconductor chip 10 and the low side source metal layer 22 of the semiconductor chip 20 provides a capacitor. However, such a capacitor usually does not provide enough capacitance for many applications.

BRIEF SUMMARY OF THE INVENTION

In accordance with one aspect of current invention, a power semiconductor device integrating a capacitor comprises a first power transistor disposed on a semiconductor chip having a first metal electrode and a second metal electrode disposed on a top surface of the semiconductor chip; a multi layer capacitor comprising a plurality of a first capacitor plates interconnected as a first capacitor electrode and a plurality of a second capacitor plates interconnected as a second capacitor electrode stacking atop of the semiconductor chip. The first capacitor plates and the second capacitor plates are alternatively configured at intervals with a dielectric layer filling a space there between for electrically isolating the type-one capacitor plates from the type-two capacitor plates. The first capacitor electrode being electrically connected to the first metal electrode of the first transistor disposed on the top surface of the semiconductor chip. In one embodiment, the first capacitor plates and the second capacitor plates are substantially parallel to the top surface of the semiconductor chip. In another embodiment, the power semiconductor device integrating a capacitor further comprises a first laminated electrode pad comprising a plurality of interconnecting conductive layers each separated by a dielectric layer with a plurality of connection vias there through for interconnection, the first laminated electrode pad being disposed atop and electrically connected to an extension portion of the first metal electrode of the first transistor so as to export the first metal electrode of the first transistor. In one embodiment, each type-one capacitor plate further extending to a corresponding conductive layer of the first laminated electrode pad thus electrically connecting to the first metal electrode of the first transistor. In another embodiment, a type-two connection plate is disposed alongside but insulated from one of the plurality of type-one capacitor plates, the type-two connection plate providing electrical connections to the type-two capacitor plates right above and below the one type-one capacitor plate. In another embodiment the power semiconductor device integrating a capacitor further comprises a second laminated electrode pad comprising a plurality of interconnecting conductive layers each separated by a dielectric layer with a plurality of connection vias there through for interconnection, the second laminated electrode pad being disposed atop and electrically connected to the second metal electrode of the first transistor so as to export the second metal electrode of the first transistor. In another embodiment, the power semiconductor device integrating a capacitor further comprises a second transistor disposed on the semiconductor chip with a third metal electrode and a fourth metal electrode disposed on the top surface of the semiconductor chip wherein the second capacitor electrode electrically connected to the third metal. A third laminated electrode pad comprising a plurality of interconnecting conductive layers each separated by a dielectric layer with a plurality of connection vias there through for interconnection is disposed atop and electrically connected to an extension portion of the third metal electrode so as to export the third metal electrode and a fourth laminated electrode pad comprising a plurality of interconnecting conductive layers each separated by a dielectric layer with a plurality of connection vias there through for interconnection, the fourth laminated electrode pad being disposed atop and electrically connected to the fourth metal electrode of the second transistor so as to export the fourth metal electrode of the second transistor. In another embodiment each type-two capacitor plate further extends to a corresponding conductive layer of the third laminated electrode pad thus electrically connecting to the third metal electrode of the second transistor.

According to another aspect of the invention a method for integrating a capacitor onto a power semiconductor device comprises the steps:
 a. providing a first power transistor disposed on a semiconductor chip, wherein the first power transistor having a first metal electrode and a second metal electrode disposed on a top surface of the semiconductor chip;
 b. depositing a dielectric layer overlaying the top surface, forming a plurality of conducting vias through the dielectric layer on top of the first metal electrode and the second metal electrode;
 c. depositing a conductive layer overlaying the dielectric layer, said conductive layer electrically connecting to the first and second metal electrodes through the conducting vias;
 d. patterning the conductive layer to form a capacitor plate above the first metal electrode and a second electrode extending structure above the second metal electrode;
 e. repeating steps b to d until a predetermined number of capacitor plate layers being provided.

In one embodiment the first metal electrode further comprises an extension portion and step b further provides a plurality of conducting vias through the dielectric layer on top of the first metal electrode extension portion. In another embodiment step d further patterns the conductive layer to form a first metal electrode extending structure on top of the first metal electrode extension portion and separated from the capacitor plate. In another embodiment step d further patterning the conductive layer to form a capacitor connecting plate separated from the capacitor plate and step b further provides a plurality of conducting vias through the dielectric layer below the capacitor connecting plate. In another embodiment the capacitor plate extends to a region above the first metal electrode extending structure. In one embodiment, the capacitor plate is electrically isolated from the first metal electrode. In another embodiment the capacitor plate is electrically connecting to the first metal electrode. In one embodiment, the capacitor connecting plate is electrically connecting to the first metal electrode. In another embodiment the capacitor connecting plate is electrically isolated from the first metal electrode. In another embodiment step a further provides a second power transistor disposed on the semiconductor chip having a third metal electrode and a fourth metal electrode disposed on the top surface of the semiconductor chip. In one embodiment, step b further forms a plurality of conducting vias through the dielectric layer on top of the third metal electrode and the fourth metal electrode. In another embodiment, step c further provides said conductive layer electrically connecting to the third and fourth metal electrodes through the conducting vias. In another embodiment step d further patterns the conductive layer to form a fourth electrode extending structure above the fourth metal electrode. In another embodiment step d further patterning the conductive layer to form the capacitor plate extending above the first metal electrode and the third metal electrode. In one embodiment the first and third metal electrodes each further comprising an extension portion and step b further providing a plurality of conducting vias through the dielectric layer on top of the first and third metal electrode extension portions and step d further patterning the conductive layer to form a first metal electrode extending structure on top of the first metal electrode extension portion and separated from the capacitor plate. In another embodiment the capacitor plate extends to a region above the third metal electrode extending structure. In one embodiment step d further patterning the conductive layer to form a third metal electrode extending structure on top of the third metal electrode extension portion and separated from the capacitor plate. In another embodiment the capacitor plate extends to a region above the first metal electrode extending structure. In one embodiment the first power transistor is a MOSFET, the first metal electrode is a source electrode and the second electrode is gate electrode. In another embodiment the second power transistor is a MOSFET, the third metal electrode is a drain electrode and the fourth electrode is gate electrode. These and other aspects of the invention are discussed more fully below.

BRIEF DESCRIPTION OF THE DRAWINGS

FIG. 4A-2 is a perspective view of the back side of the structure in Embodiment 3 of the present invention.

FIG. 5A-1 is a perspective view of the front side of the structure in Embodiment 4 of the present invention.

FIG. 5A-2 is a perspective view of the rear side of the structure in Embodiment 4 of the present invention.

FIG. 6A-1 is a perspective view of the front side of the structure in Embodiment 5 of the present invention.

FIG. 6A-2 is a perspective view of the rear side of the structure in Embodiment 5 of the present invention.

DETAILED DESCRIPTION OF THE INVENTION

Embodiment 1

Figure 2A:
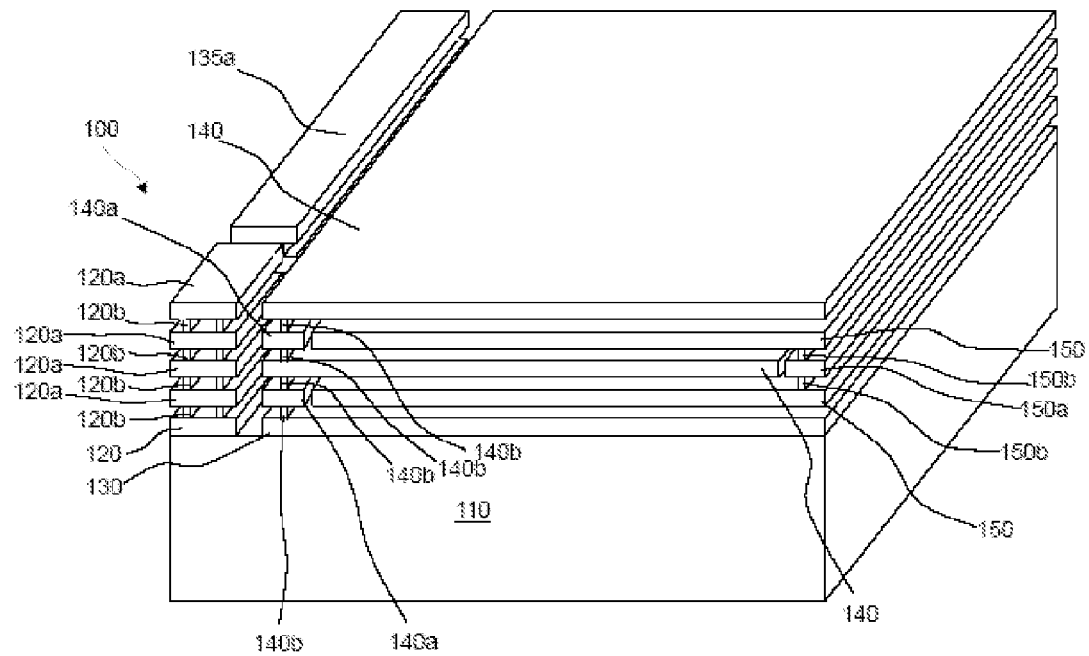
FIG. 2A is a perspective view of a structure in Embodiment 1 of the present invention.
Figure 2B:
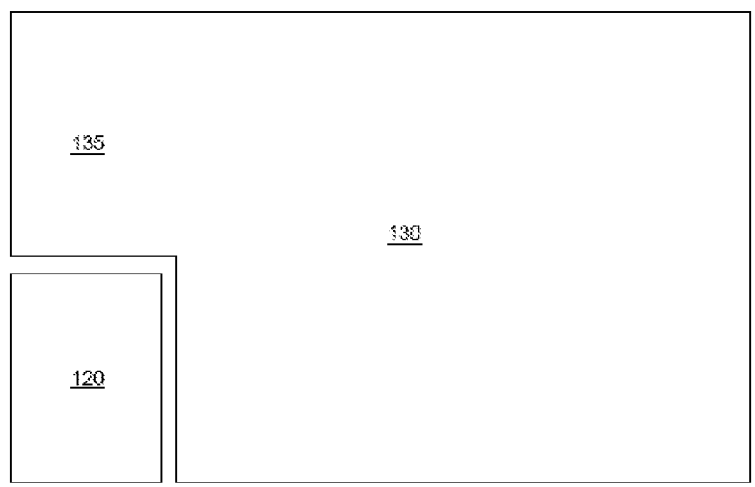
FIG. 2B is a plan view of the gate metal layer, the source metal layer and the extension portion of the source metal layer on the top of the silicon die substrate corresponding to the perspective view in Embodiment 1 of the present invention.

FIG. 2A is a perspective view of Embodiment 1 structure of a MOSFET 100 integrated a multi-layer capacitor on its top and FIGS. 2B-2F are the top views of each layer of capacitor plate stacking over the top surface of the MOSFET corresponding to the perspective view of the Embodiment 1 structure. As shown in FIGS. 2A and 2B, a gate metal layer 120 forming the gate electrode of the MOSFET 100 and a source metal layer 130 forming the source electrode of the MOSFET 100 are set on the top of silicon die substrate 110. The source metal layer 130 contains an extending structure 135. The drain of the MOSFET 100 is formed at the bottom of the silicon die substrate 110 (not shown).

The structure 100 provides a multi-layer capacitor containing a plurality of type-one capacitor plates 140 and a plurality of type-two capacitor plates 150 substantially parallel to the silicon die substrate 110 above the top of the silicon die substrate 110. The type-one capacitor plates 140 and the type-two capacitor plates 150 are alternatively configured at intervals (interdigitated) with a dielectric layer filling a space there between to electrically isolate the type-one capacitor plates from the type-two capacitor plates, while the type-one capacitor plates 140 are electrically connected with each other to form one electrode of the bypass capacitor electrically connecting with the source metal layer 130 and the type-two capacitor plates 150 are electrically connected with each other to form the other electrode of the bypass capacitor. A dielectric layer filling a space between the source metal layer 130 and the type-two capacitor plates 150. In this Embodiment 1, source layer 130 also functions as part of the multi-layer capacitor forming the most bottom plate layer.

In addition, except for the most top capacitor plate layer and the most bottom capacitor plate layer, each intermediate layer of capacitor plate further includes a main capacitor plate (type-one or type-two) covering a majority area of the first metal electrode and a capacitor connecting plate alongside but separated from the main capacitor plate. The type-one capacitor plate layers each includes a type-one capacitor plate 140 and a type-two connecting plate 150a separated from the type-one capacitor plate 140 and the type-two capacitor lay- ers each includes a type-two capacitor plate 150 and a type-one connecting plate 140a separated from the type-two capacitor plate 150. The type-one connecting plates 140a are disposed on one location vertically aligned with each other while the type-two connecting plates 150a are disposed on a separate location vertically aligned with each other. Each connecting plate electrically connects to the capacitor plates immediately above and below its layer through a plurality of connecting vias open through each dielectric layer sandwiched between each layer, such that type-one capacitor plates 140 are electrically connecting together by the type-one connecting plates 140a located on different layers through connecting vias 140b to the source metal 130 and type-two capacitor plates 150 are electrically connecting together by the type-two connecting plates located on different layers through connecting vias 150b.

A laminated gate pad comprising a plurality of conductive layers 120a stacking together is disposed on gate metal 120 with a dielectric layer sandwiched between any two conductive layers. Each conductive layer 120a is electrically connected by a plurality of connecting vias 120b opened through each dielectric layer to the gate metal layer 120. The total number of conductive layer 120a may be the sum of type-one capacitor plate 140 and type-two capacitor plate 150. A laminated source pad comprising a plurality of conductive 135a stacking together is disposed on the extension portion 135 of source metal 130 with a dielectric layer sandwiched between any two conductive layers. Each conductive layer 135a is electrically connected by a plurality of connecting vias (not shown) opened through each dielectric layer to the source metal layer 130. The total number of conductive layer 135a may be the sum of type-one capacitor plate 140 and type-two capacitor plate 150. The gate pad and the source pad are electrically isolated.

Figure 2C:
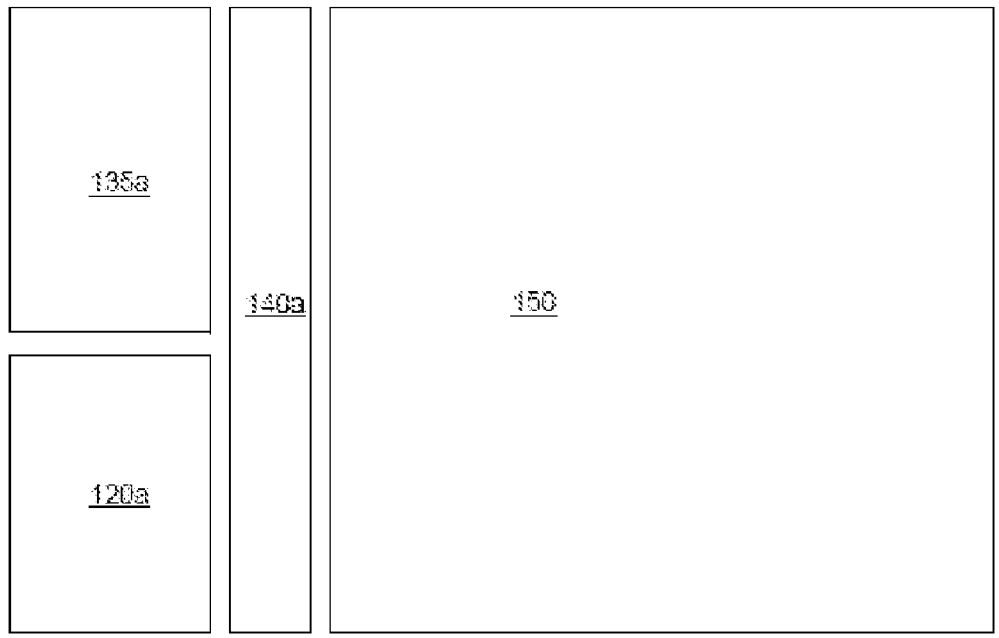
FIG. 2C-2F are the plan views of each layer of capacitor plates corresponding to the perspective view in Embodiment 1 of the present invention.
Figure 2D:
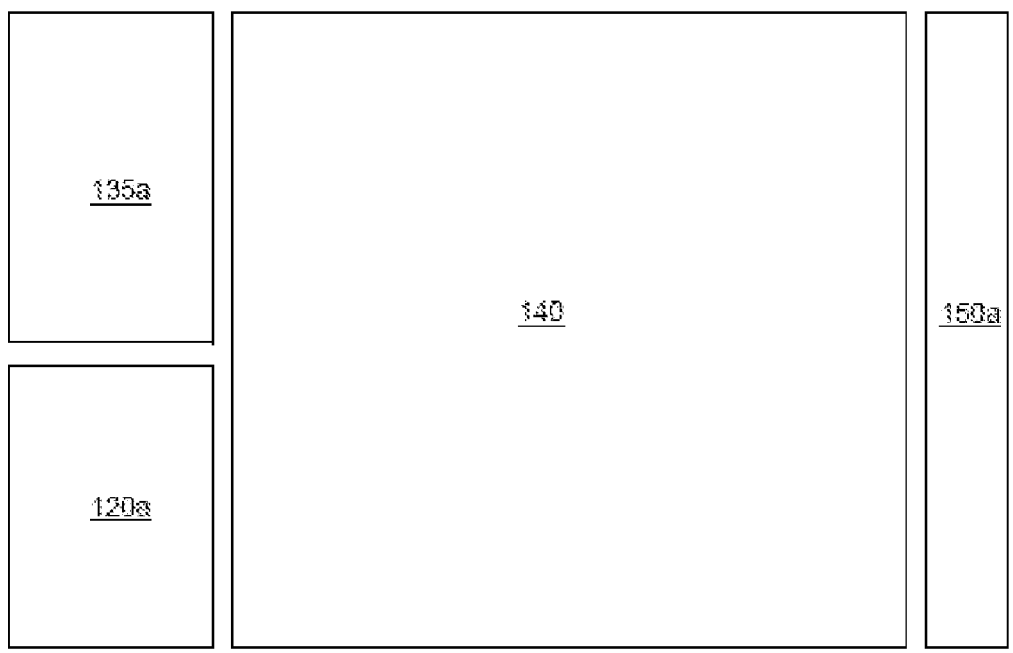
Figure 2E:
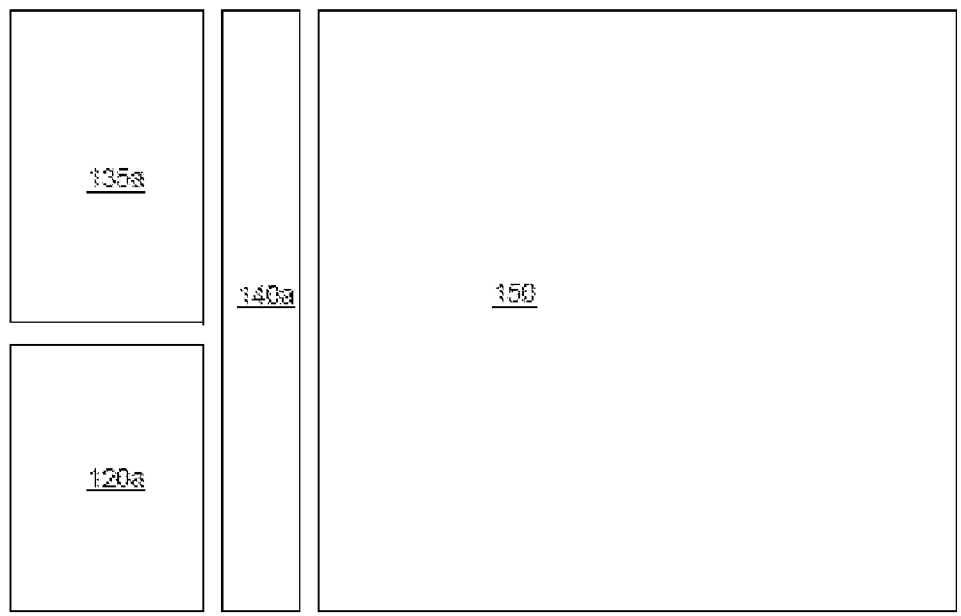
Figure 2F:
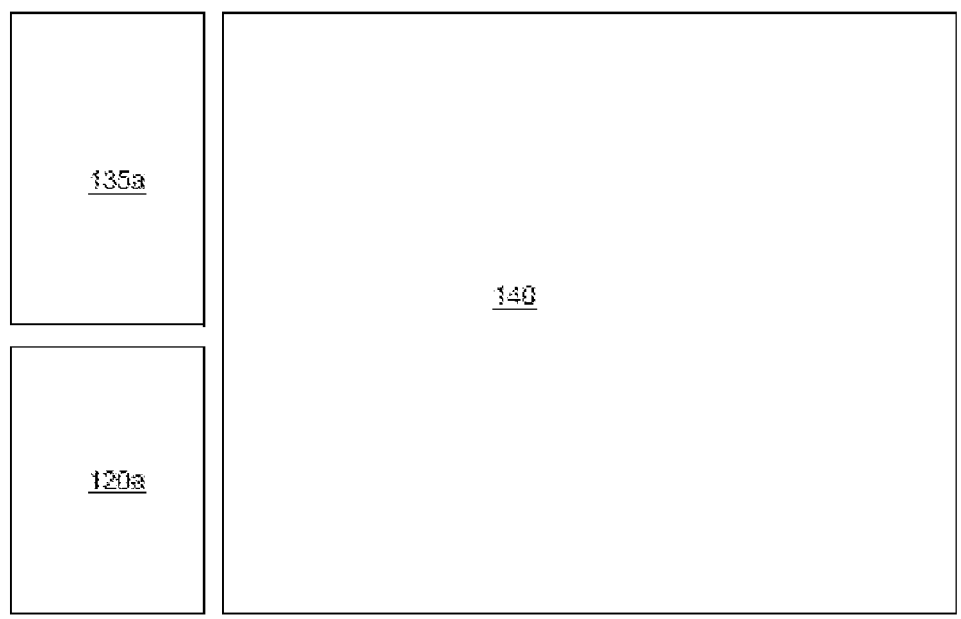

The process of making the multi-layer capacitor on top of MOSFET as provided in Embodiment 1 may star with a first dielectric layer (not shown) such as a silicon oxide or nitride deposited on top of the electrodes of semiconductor chip covering an entire top surface of FIG. 2B followed by a masked etching process to provide connection vias on top of gate metal layer 120, source metal layer 130 and source metal extension portion 135. A first conductive layer (such as a metal or a highly doped poly silicon) is then deposited on top of the first dielectric layer and filling the connection vias electrically connected to each electrode. As shown in FIG. 2C, the first conductive layer is patterned into multiple portions each isolated from the other to form a type-one capacitor connection plate 140a over a portion of the source metal, a type-two capacitor plate 150 over a major portion of the source metal, as well as a source extending structure 135a over the source extension portion 135, a gate extending structure 120a over the gate metal 120 respectively. Each conductive portion electrically connects to its underlying electrode respectively through the connecting vias without cross connecting to other electrode. In FIG. 2D, a second dielectric layer (not shown) is deposited over the entire surface with corresponding connecting vias etched through, followed by a second conductive layer (metal or doped poly) deposited and patterned to form a type-one capacitor plate 140 over a major portion of the source metal 532 and a type-two capacitor connection plate 150a over a portion of the source metal 140, as well as a source extending structure 135a over the source extending portion 135, a gate extending structure 120a over the gate metal 120 respectively. Each conductive portion electrically connects to its underlying portion respectively through the connecting vias without cross connecting to other electrode. FIG. 2E repeats the step of FIG. 2C. Additional layers of dielectric and conductive layer can be stack on the structure by repeating the process shown in FIGS. 2D and 2C depending on the requirement of capacitance. In the final step, the last conductive layer may be patterned into a large type-one or type two capacitor plate over the source metal without the other type of connecting plate, as shown in FIG. 2F (type-two is shown). The last conductive layer is preferably a metal layer.

As shown in FIG. 2B-2F, the gate metal layer 120 and the source metal layer 130 are separated from each other, and the separation area between the gate metal layer 120 and the source metal layer 130 is filled with dielectric media. Each layer of the capacitor plate also contains separation area for insulating against and separating the device structures without mutual electrical connection in the layer (such as the capacitor plate, the laminated extending structure and the laminated gate conductive layer), and the separation area is filled with dielectric media. The number of the type-one capacitor plates 140 and type-two capacitor plates 150 is not limited by that shown in FIG. 2A-2F. In the Embodiment 1 shown in FIG. 2A, both the bottom plate (source metal layer 130) and the top plate layers of the multi-layer capacitor are type-one plate layers, alternatively the capacitor can be formed with a type-one layer on the bottom connected to the source of MOSFET and a type-2 layer on the top for providing access to the electrode of the capacitor.

Embodiment 2

Figure 3A:
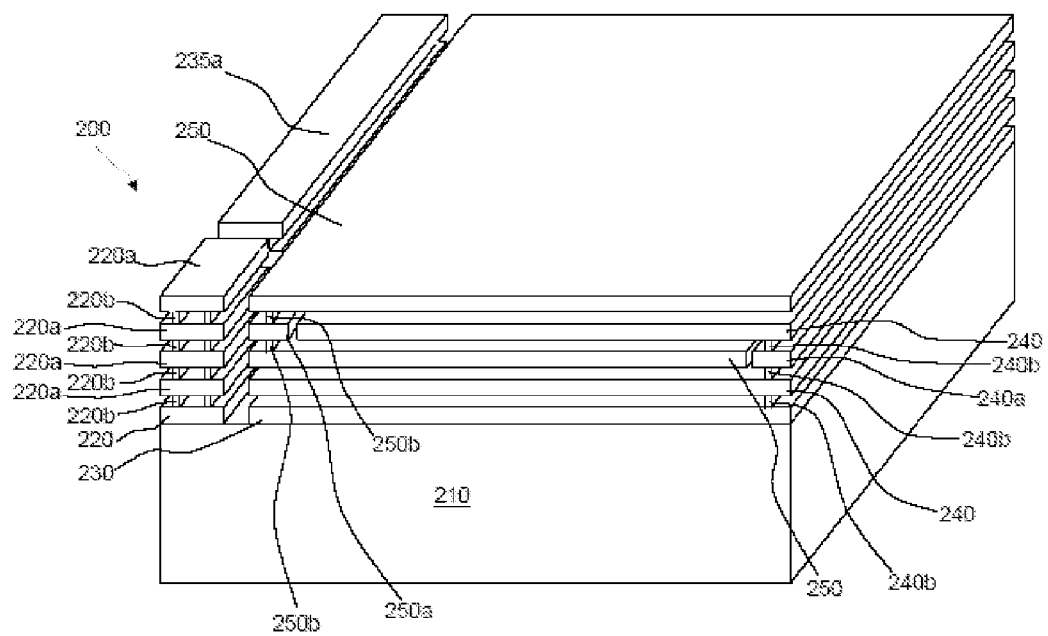
FIG. 3A is a perspective view of the structure in Embodiment 2 of the present invention.
Figure 3B:
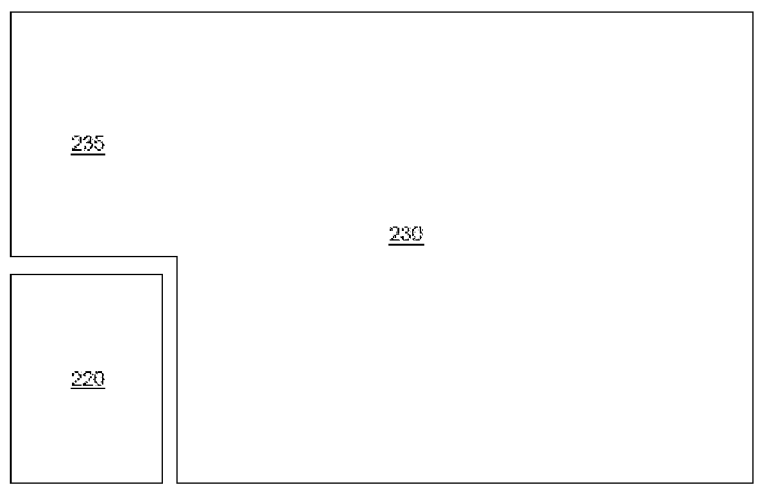
FIG. 3B is a plan view of the gate metal layer, the source metal layer and the extension portion of the source metal layer on the top of the silicon die substrate corresponding to the perspective view in Embodiment 2 of the present invention.
Figure 3C:
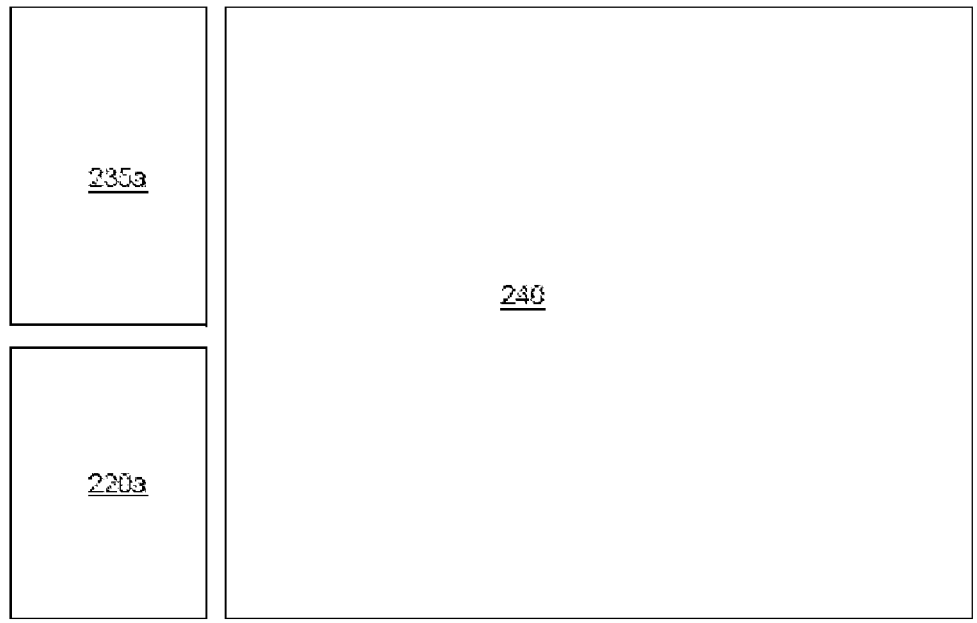
FIG. 3C-3F are the plan views of each layer of capacitor plate corresponding to the perspective view in Embodiment 2 of the present invention.
Figure 3D:
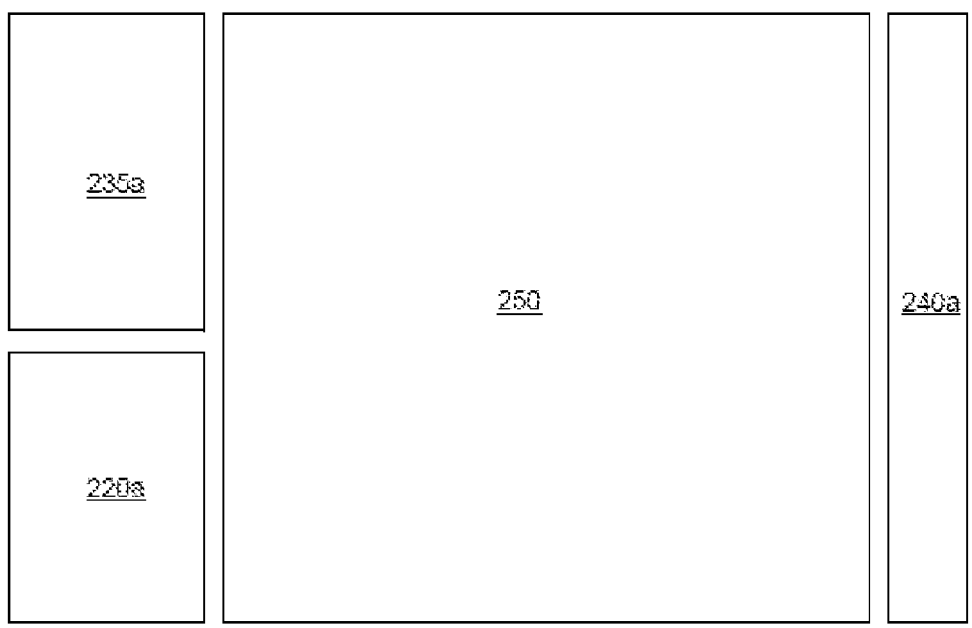
Figure 3E:
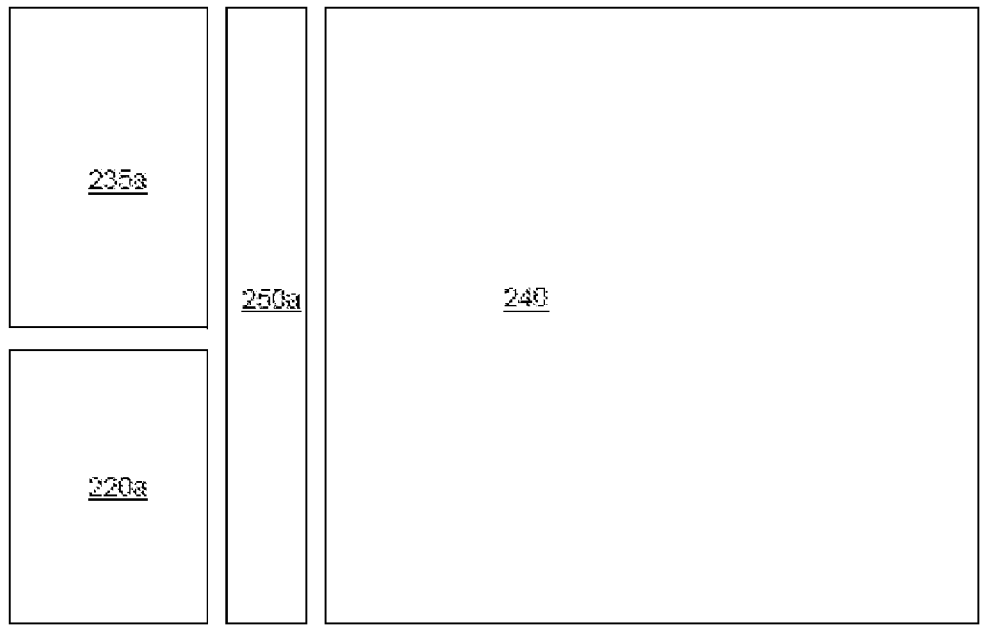
Figure 3F:
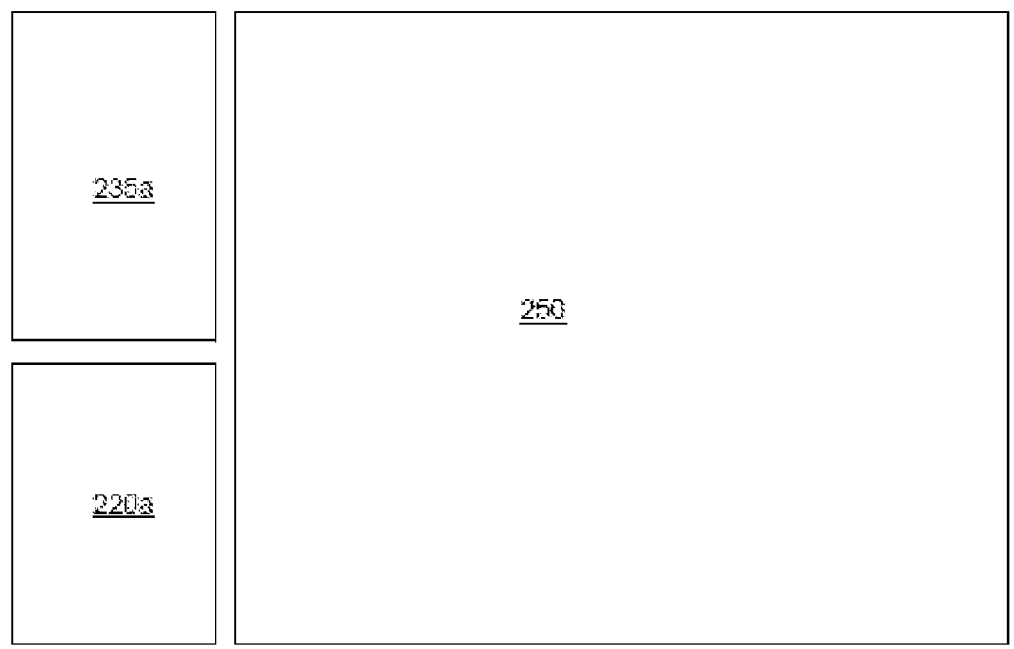

As shown in FIGS. 3A (a perspective view of the Embodiment 2 structure) and 3B-3F (the top views of each layer of capacitor plate stacking over the top surface of the MOSFET corresponding to the perspective view of the Embodiment 2 structure), a gate metal layer 220 forming the gate electrode of a MOSFET 200 and a source metal layer 230 forming the source electrode of the MOSFET 200 are set on the top of the silicon die substrate 210, wherein the source metal layer 230 contains an extending structure 235. The drain (not shown in the figure) of the MOSFET 200 is formed at the bottom of the silicon die substrate 210.

A multi-layer capacitor plate comprising a plurality of type-one capacitor plates 240 and a plurality of type-two capacitor plates 250 substantially parallel to the silicon die substrate 210 is set above the top of the silicon die substrate 210. The type-one capacitor plates 240 and the type-two capacitor plates 250 are alternatively configured at intervals (interdigitated) with a dielectric layer filling a space there between for electrically isolating the type-one capacitor plates from the type-two capacitor plates, while the type-one capacitor plates 240 are electrically connected with each other to form one electrode of the bypass capacitor electrically connecting with the source metal layer 230 and the type-two capacitor plates 250 are electrically connected with each other to form the other electrode of the bypass capacitor. A dielectric layer filling a space between the source metal layer 230 and a bottom type-one capacitor plates 240 disposed right on top of the source metal layer 230. Electrical connection between the bottom type-one layer 240 to the source metal layer 230 is furnished by a plurality of vias 240*b* opened through the dielectric layer. In this Embodiment 2, source layer 230 does not function as part of the multi-layer capacitor and the bottom layer plate 240 forms the most bottom plate layer of the capacitor.

In addition, except for the most top capacitor plate layer and the most bottom capacitor plate layer, each intermediate layer of capacitor plate further includes a main capacitor plate (type-one or type-two) and a connecting plate separated from the main plate. The type-one capacitor plate layers each includes a type-one capacitor plate 240 and a type-two connecting plate 250*a* separated from the type-one capacitor plate 240 and the type-two capacitor layers each includes a type-two capacitor plate 250 and a type-one connecting plate 240*a* separated from the type-two capacitor plate 250. The type-one connecting plates 240*a* are disposed on one location vertically aligned with each other while the type-two connecting plates 250*a* are disposed on a separate location vertically aligned with each other. Each connecting plate electrically connects to the capacitor plates immediately above and below its layer through a plurality of connecting vias open through each dielectric layer sandwiched between each conductive layer, such that type-one capacitor plates 240 are electrically connecting together by the type-one connecting plates 240*a* located on different layers through connecting vias 240*b* to the source metal 230 and type-two capacitor plates 250 are electrically connecting together by the type-two connecting plates located on different layers through connecting vias 250*b*.

A laminated gate pad comprising a plurality of conductive layers 220*a* stacking together is disposed on gate metal 220 with a dielectric layer sandwiched between any two conductive layers. Each conductive layer 220*a* is electrically connected by a plurality of connecting vias 220*b* opened through each dielectric layer to the gate metal layer 220. The total number of conductive layer 220*a* may be the sum of type-one capacitor plate 240 and type-two capacitor plate 250. A laminated source pad comprising a plurality of conductive layers 235*a* stacking together is disposed on the extension portion 235 of source metal 230 with a dielectric layer sandwiched between any two conductive layers. Each conductive layer 235*a* is electrically connected by a plurality of connecting vias (not shown) opened through each dielectric layer to the source metal layer 230. The total number of conductive layer 235*a* may be the sum of type-one capacitor plate 240 and type-two capacitor plate 250. The laminated gate pad and the laminated source pad are electrically isolated.

Embodiment 3

Figures 1, 4A:
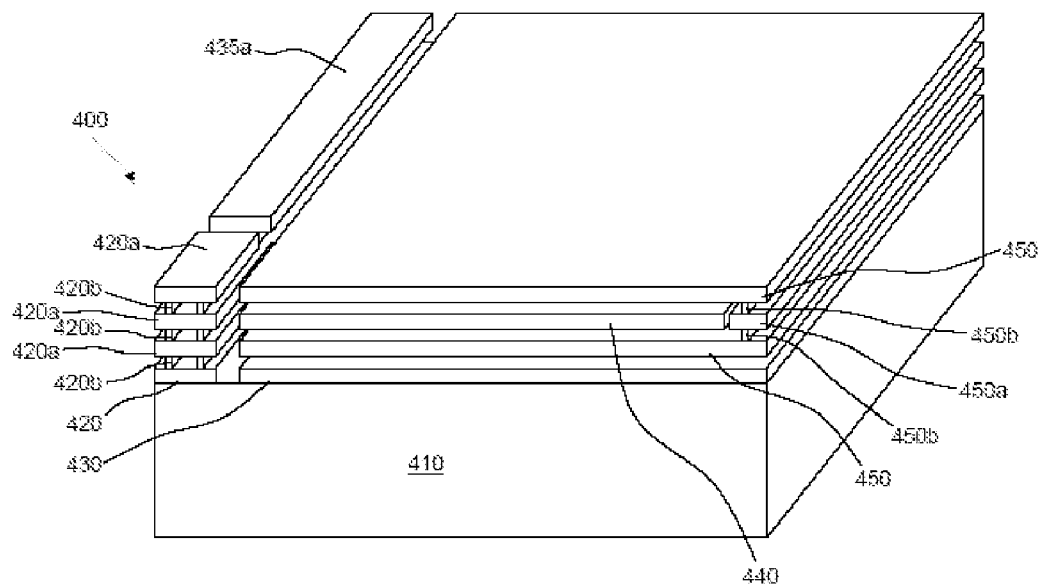
FIG. 4A-1 is a perspective view of the front side of the structure in Embodiment 3 of the present invention.

As shown in FIGS. 4A-1 a front side perspective view and 4A-2, a back side perspective view as well as FIGS. 4B-4E, the top views of each layer of capacitor plate stacking over the top surface of the MOSFET corresponding to the perspective view of the Embodiment 3 structure, a gate metal layer 420 forming the gate electrode of the MOSFET 400 and a source metal layer 430 forming the source electrode of the MOSFET 400 are set on the top of the silicon die substrate 410, wherein the source metal layer 430 contains an extending structure 435. A multi-layer capacitor containing a plurality of type-one capacitor plate 440 and a plurality of type-two capacitor plates 450 substantially parallel to the silicon die substrate 410 are set above the top of the silicon die substrate 410.

The type-one capacitor plates 440 and the type-two capacitor plates 450 are alternatively configured at intervals (interdigitated) with a dielectric layer filling a space there between for electrically isolating the type-one capacitor plates from the type-two capacitor plates, while the type-one capacitor plates 440 are electrically connected with each other to form one electrode of the bypass capacitor electrically connecting with the source metal layer 430 and the type-two capacitor plates 450 are electrically connected with each other to form the other electrode of the bypass capacitor. A dielectric layer filling a space between the source metal layer 430 and the type-two capacitor plates 450. In this Embodiment 3, source layer 430 also functions as part of the multi-layer capacitor forming the most bottom plate layer.

Figures 2, 4A:
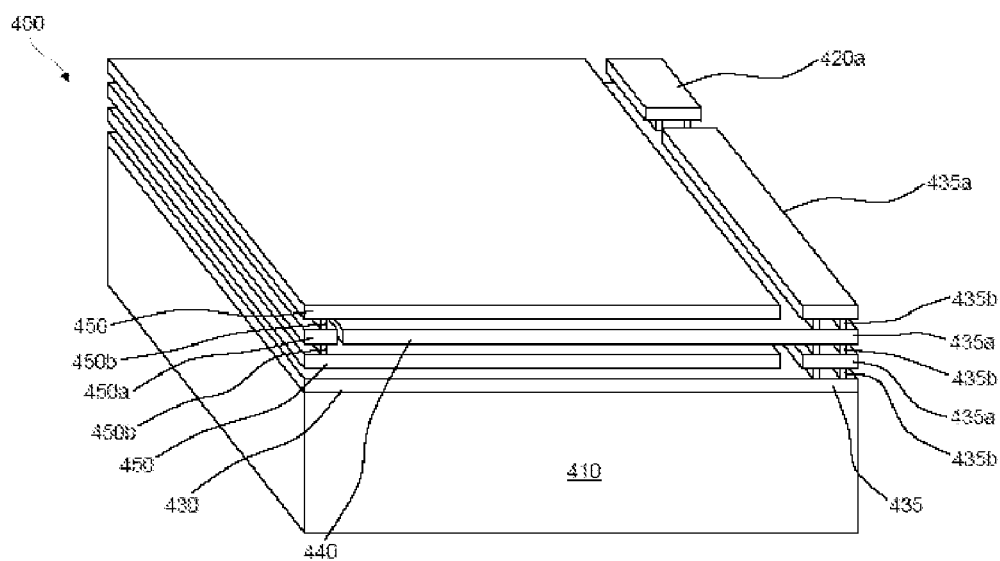
Figure 4B:
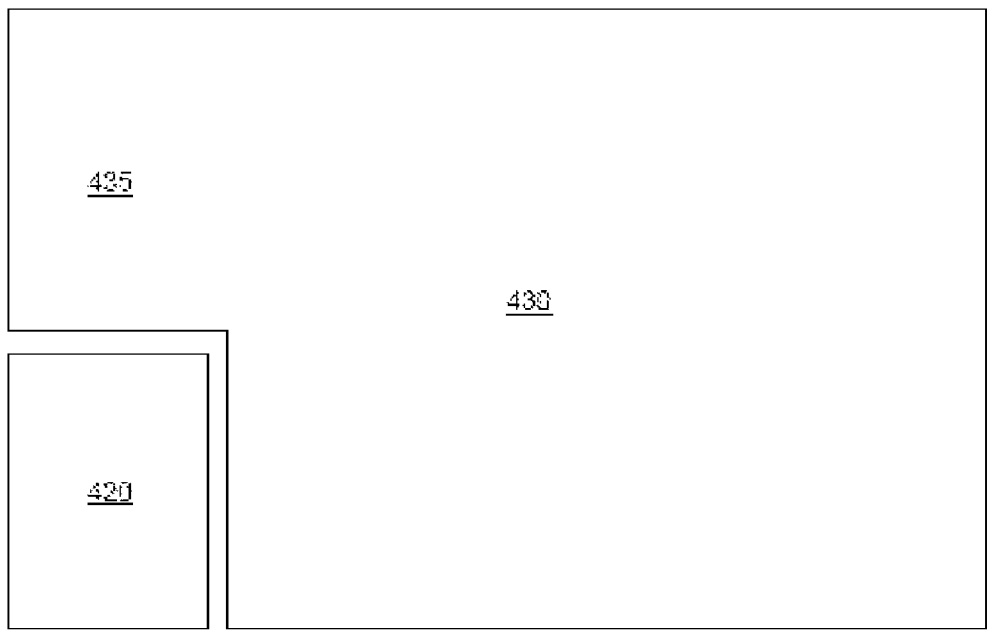
FIG. 4B is a plan view of the gate metal layer, the source metal layer and the extension portion of the source metal layer on the top of the silicon die substrate corresponding to the perspective view in Embodiment 3 of the present invention.
Figure 4C:
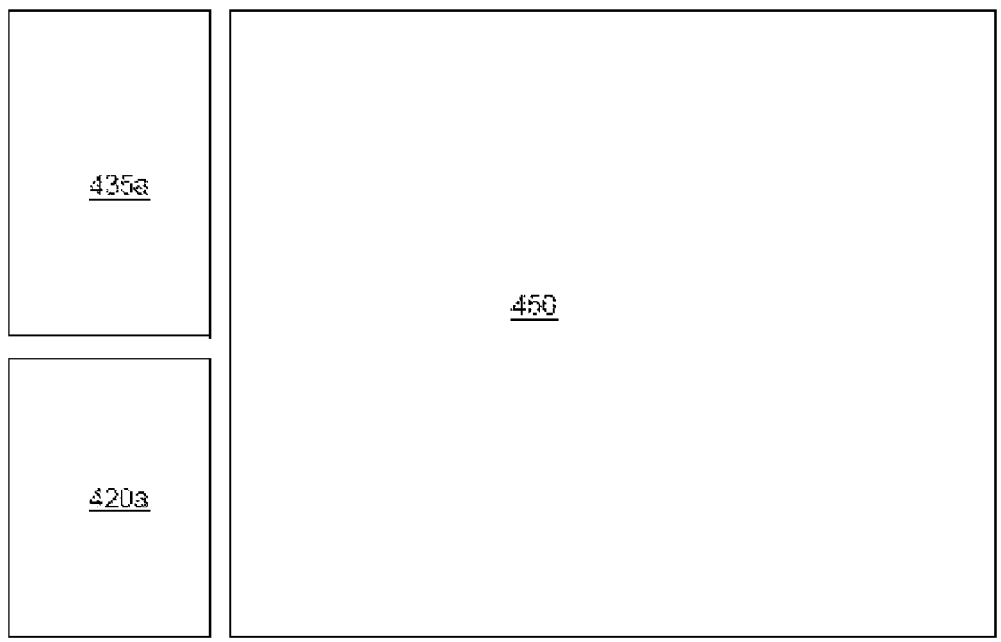
FIG. 4C-4E are the plan views of each layer of capacitor plates corresponding to the perspective view in Embodiment 3 of the present invention.
Figure 4D:
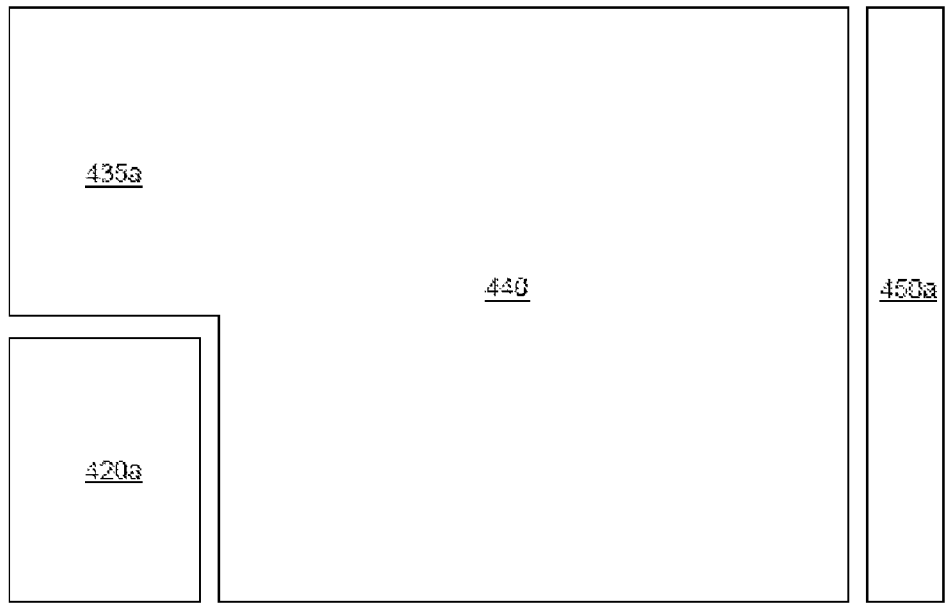
Figure 4E:
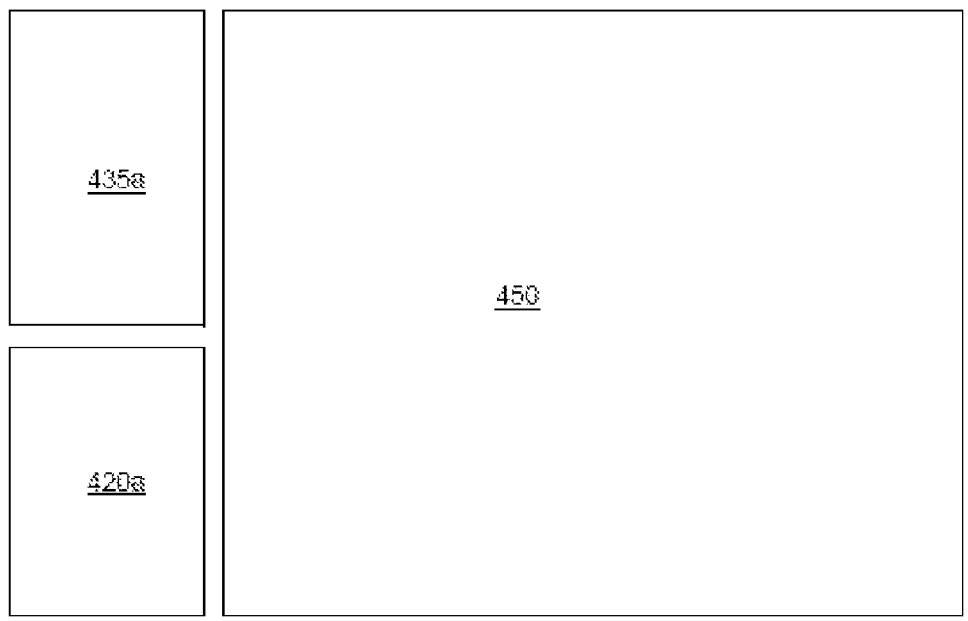

As shown in FIG. 4A-1, a laminated gate pad comprising a plurality of conductive layers 420a stacking together is disposed on gate metal 420 with a dielectric layer sandwiched between any two conductive layers. Each conductive layer 420a is electrically connected to the gate metal layer 420 by a plurality of connecting vias 420b opened through each dielectric layer. The total number of conductive layer 420a may be the sum of type-one capacitor plate 440 and type-two capacitor plate 450. As shown in FIG. 4A-2, a laminated source pad comprising a plurality of conductive layers 435a stacking together is disposed on the extension portion 435 of source metal 430 with a dielectric layer sandwiched between any two conductive layers. Each conductive layer 435a is electrically connected by a plurality of connecting vias 435b opened through each dielectric layer to the source metal layer 430. The total number of conductive layer 435a may be the sum of type-one capacitor plate 440 and type-two capacitor plate 450. The gate pad and the source pad are electrically isolated.

In addition, except for the most bottom capacitor plate layer, each type-one capacitor plate layer includes a type-one capacitor plate 440 and a type-two connecting plate 450a separated from the type-one capacitor plate 440 and each type-two capacitor layer includes a type-two capacitor plate 450 and a type-one connecting plate 435a constituting as a layer of laminated source pad and separated from the type-two capacitor plate 450. The type-one connecting plates 435a are disposed on the location vertically aligned with the extension portion 435 of source metal 430 while the type-two connecting plates 435a are disposed on a separate location vertically aligned with each other. Each type-one capacitor plate 440 extends over the extension portion 435 of source metal 430 thus providing an extension 435a constituting a corresponding layer of the laminated source pad. Each connecting plate electrically connects to the capacitor plates immediately above and below its layer through a plurality of connecting vias open through each dielectric layer sandwiched between each layer, such that type-one capacitor plates 440 are electrically connecting together by the type-one connecting plates 435a located on different layers through connecting vias 435b to the source metal 430 and type-two capacitor plates 450 are electrically connecting together by the type-two connecting plates located on different layers through connecting vias 450b.

Embodiment 4

Figures 1, 5A:
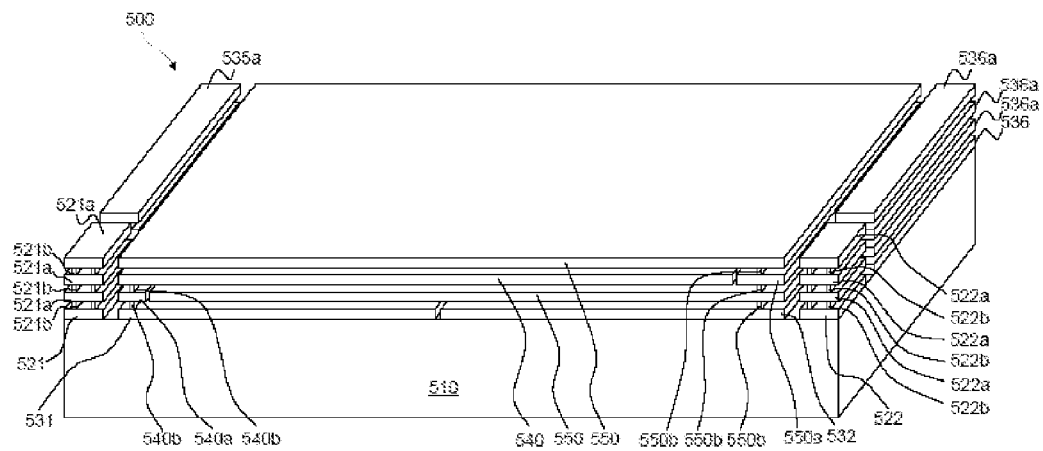
Figures 2, 5A:
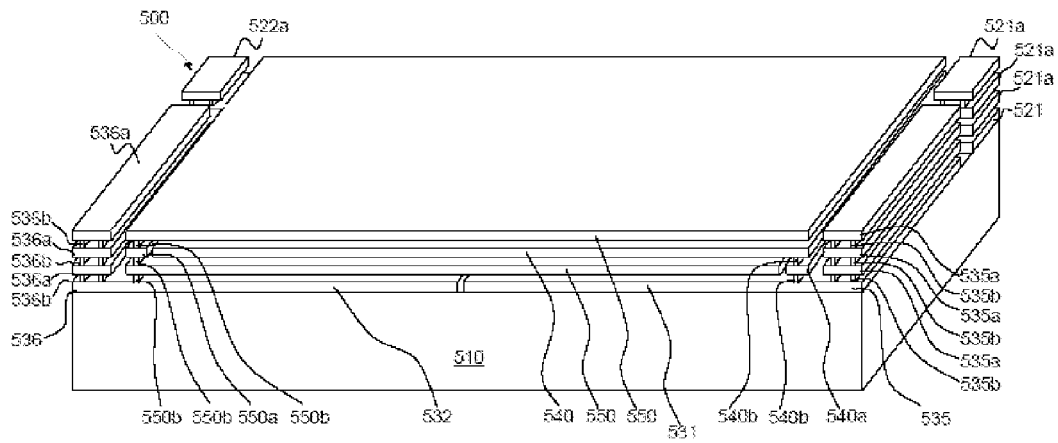

The embodiments above are suitable for a low side MOSFET of single chip integrating a capacitor for DC-DC converter applications. The technical solution for the dual MOSFET (containing a low side MOSFET and a high side MOSFET) integrating a capacitor is as below:

FIGS. 5A-1 and 5A-2 are perspective views of the front side and rear side respectively of the structure 500 of a bypass capacitor integrated on a semiconductor chip comprising a high side MOSFET and a low side MOSFET integrated on silicon substrate 510, and FIGS. 5B-5E are the top view of each layer of capacitor plate stacking over the top surface of the MOSFET corresponding to the perspective view of the Embodiment 4.

Figure 1A:
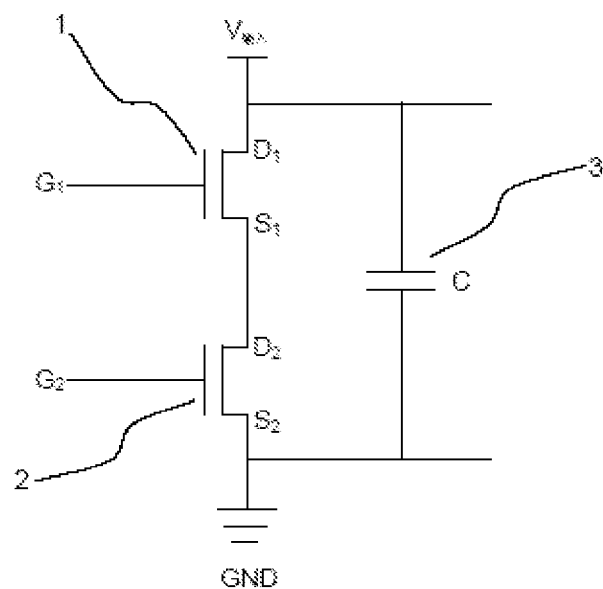
FIG. 1A is a circuit diagram of a DC-DC convertor with a capacitor connecting onto a low side MOSFET and a high side MOSFET.
Figure 1B:
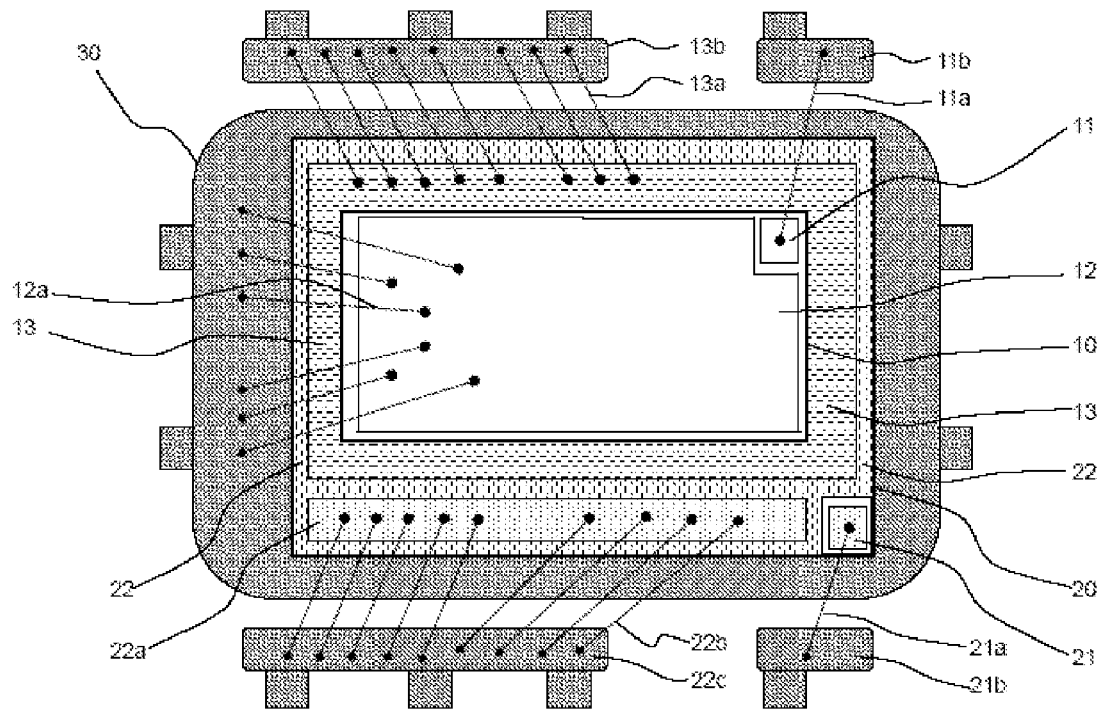
FIG. 1B is a top view of a structure of co-packaging a capacitor chip with the low side MOSFET and the high side MOSFET corresponding to the circuit diagram in FIG. 1A in the prior art.

The structure 500 comprises a first MOSFET and a second MOSFET each having a source, a gate and a drain disposed on a semiconductor substrate 510. The source (not shown in the figure) of the first transistor is formed at a first bottom portion of the silicon die substrate 510, the drain and gate of the first transistor (not shown in the figure) are formed on a first top portion overlaying the first bottom portion of the silicon die substrate 510; the drain (not shown in the figure) of the second transistor is formed at a second bottom portion of the silicon die substrate 510, the source and gate of the second transistor (not shown in the figure) are formed on the second top portion overlaying the second bottom portion of the silicon die substrate 510. While the drain and gate of the first transistor as well as the source and gate of the second transistor are electrically isolated from each other, the source of the first transistor and the drain of second transistor are connected through the bottom of silicon substrate 510 and a bottom metal layer disposed on the bottom of silicon substrate 510 therefore forming the connection as shown in FIG. 1A. The method of integrating a high side MOSFET and a low side MOSFET is disclosed in US 2008/0067584 A1 assigned to the common assignee, the disclosure of which is hereby incorporated by reference.

Figure 5B:
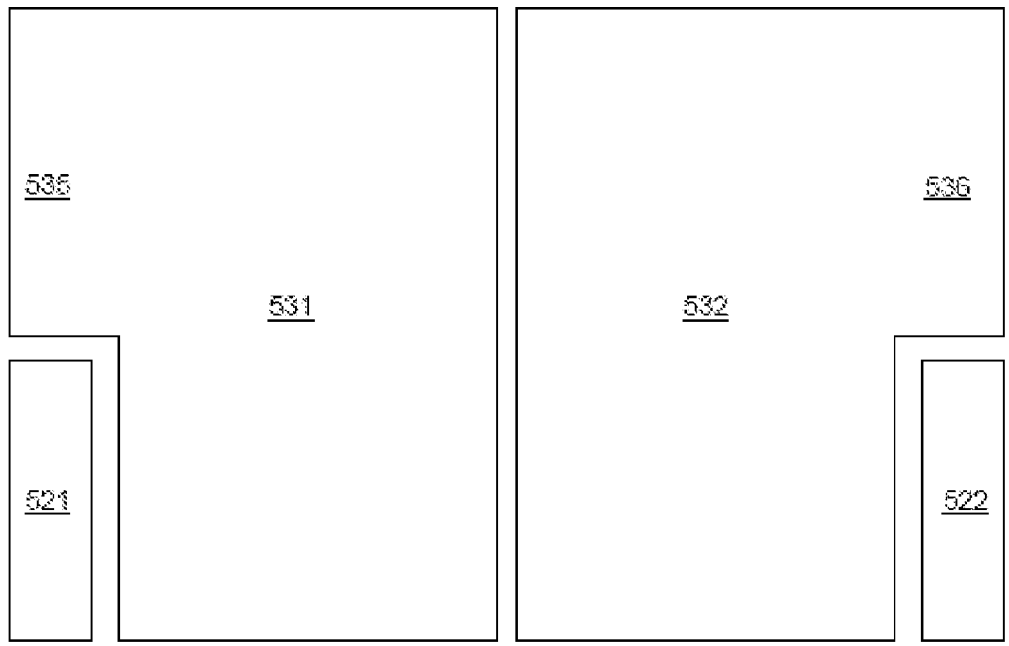
FIG. 5B is a plan views of the electrodes on top of the silicon die substrate corresponding to the perspective view in Embodiment 4 of the present invention.

As shown in FIG. 5B, A first gate metal layer 521 forming the gate electrode of the first transistor, a drain metal layer 531 with a drain metal extension portion 535 forming the drain electrode of the first transistor, a second gate metal layer 522 forming the gate electrode of the second transistor and a source metal layer 532 with a source metal extension portion 536 forming the source electrode of the second transistor are set on the top of the silicon die substrate 510. The first transistor is a high side MOSFET, and the second transistor is a low side MOSFET.

Figure 5C:
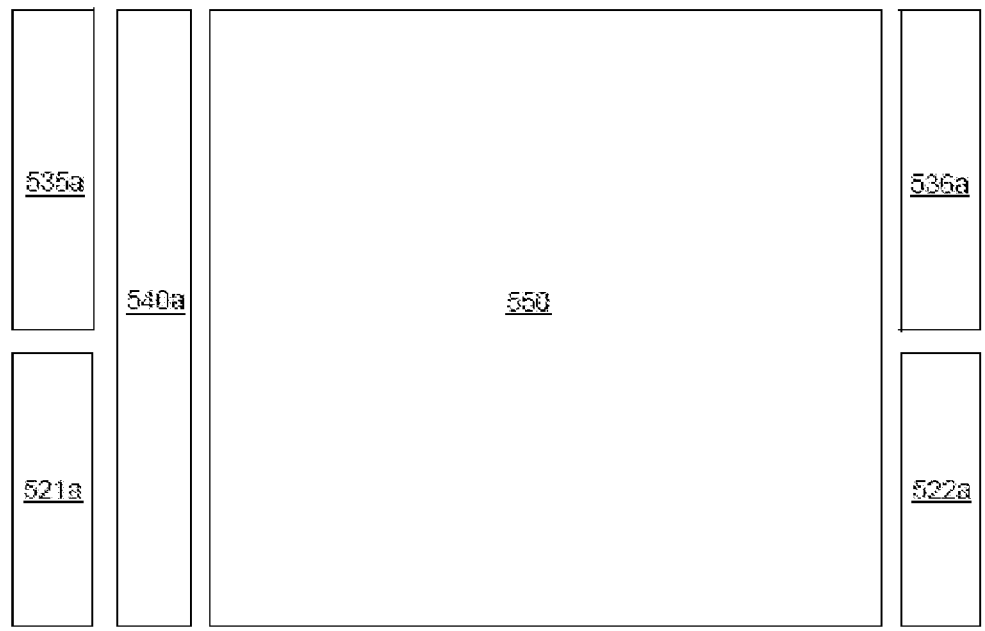
FIG. 5C-5E are the plan view of each layer of capacitor plates corresponding to the perspective view in Embodiment 4 of the present invention.
Figure 5D:
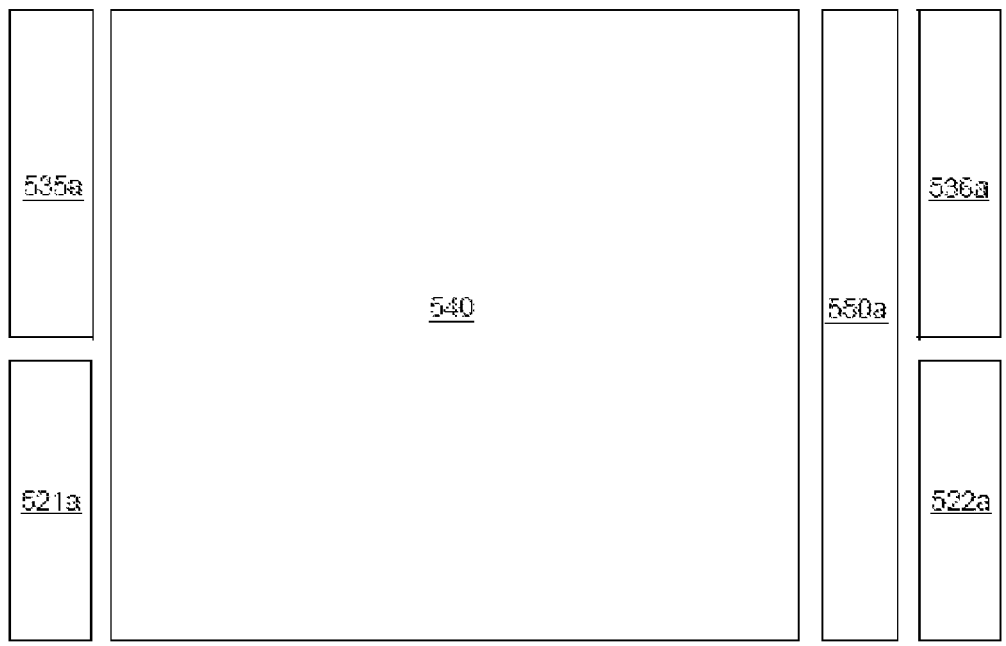

A first dielectric layer (not shown) such as an oxide is deposited on top of the electrodes of semiconductor chip covering an entire top surface followed by masked etching process to form connection vias 521b, 540b, 535b, 522b, 550b and 536b respectively on top of first gate metal layer 521, drain metal layer 531, drain metal extension 535, second gate metal layer 522, source metal layer 532 and source metal extension portion 536 (see FIGS. 5A-1 and 5A-2). A first conductive layer (such as metal or highly doped poly silicon) is then deposited on top of the dielectric layer and filling the connection vias electrically connected to each electrode. As shown in FIG. 5C, the first conductive layer is patterned into multiple portions each isolated from the other to form a type-one connection portion 540a over a portion of the source metal, a type-two capacitor plate 550 over the drain metal and a major portion of the source metal, as well as a drain extending structure 535a over the drain extending portion 535, a source extending structure 536a over the source extending portion 536, a first gate extending structure 521a over the first gate 521 and a second gate extending structure 522a over the second gate 522 respectively. Each conductive portion electrically connects to its underlying electrode respectively through the connecting vias without cross connecting to other electrode. In FIG. 5D, a second dielectric layer (not shown) is deposited over the entire surface with connecting vias etched through, followed by a second conductive material deposition and patterning to form a type-one capacitor plate 540 over the source metal 532 and a major portion of the drain metal 531, a type-two connection portion 550a over a portion of the drain metal 531, as well as a drain extending structure 535a over the drain extending portion 535, a source extending structure 536a over the source extending portion 536, a first gate extending structure 521a over first gate 521 and a second gate extending structure 522a over the second gate 522 respectively. Each conductive portion electrically connects to its underlying conductive portion respectively through connecting vias without cross connecting to other electrode. Additional layers of dielectric and conductive material can be stack on the structure by repeating the process shown in FIGS.

Figure 5E:
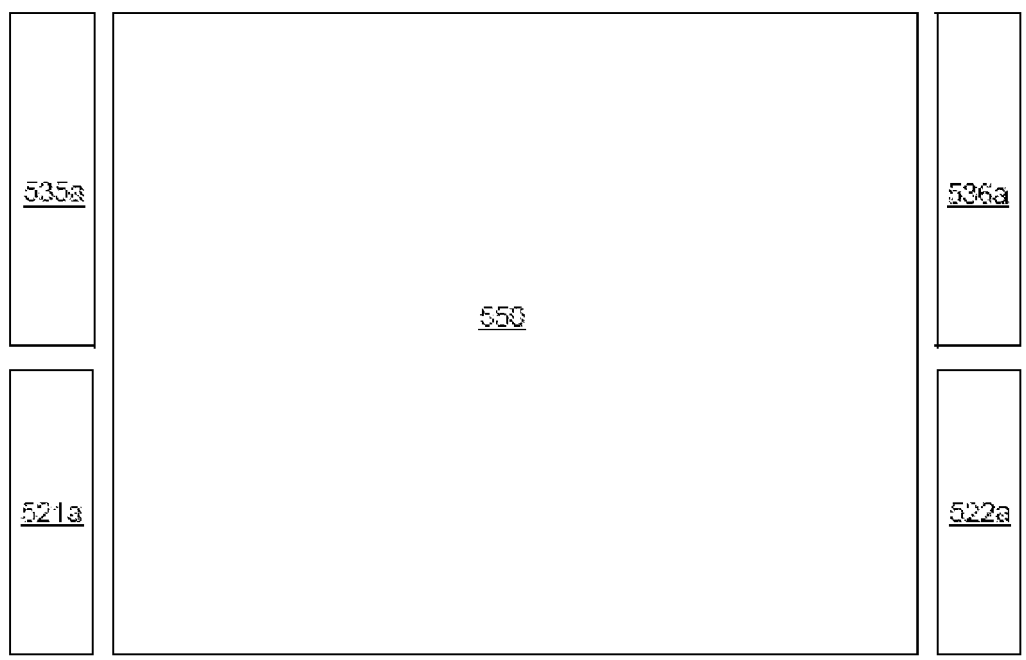

5C and 5D depending on the requirement of capacitance. In the final step, the last conductive layer may be patterned into a large type-one or type two capacitor plate over the source and drain metal without the other type of connecting portion, as shown in FIG. 5E (type-two is shown). The last conductive layer is preferably a metal layer.

The structure 500 provides a multi-layer capacitor plate containing a plurality of type-one capacitor plates 540 and a plurality of type-two capacitor plates 550 parallel to the silicon die substrate 510 are set above the top source and drain metal layer of the silicon die substrate 510, and dielectric layer (not shown in the figure) is filled between the top source and drain metal layer of the silicon die substrate 510 and one capacitor plate (such as the type-two capacitor plates 550 in the embodiment) above the top source and drain metal layer of the silicon die substrate 510, and between the neighboring two capacitor plates (such as the type-two capacitor plates 550 and the type-one capacitor plates 540).

The type-one capacitor plates 540 and the type-two capacitor plates 550 are alternatively configured at intervals (inter-digitated) with a dielectric layer filling a space there between for electrically isolating the type-one capacitor plates from the type-two capacitor plates. Moreover, the type-one capacitor plates 540 are electrically connected through connecting vias 540b with the drain metal layer 531 to form one electrode of the bypass capacitor, the type-two capacitor plates 550 are electrically connected with the source metal layer 532 to form the other electrode of the bypass capacitor.

A first laminated gate pad comprising a plurality of conductive layer 521a interconnected by vias 521b is set above and electrically connected to the first gate metal layer 521 so as to export the first gate electrode. A second laminated gate pad comprising a plurality of conductive layer 522a interconnected by vias 522b is set above and electrically connected to the second gate metal layer 522 so as to export the second gate electrode. A laminated drain pad comprising a plurality of conductive layer 535a set above and electrically connected to the drain extension portion 535 thus outputs the drain electrode and a laminated source pad comprising a plurality of conductive layer 536a set above and electrically connected to the source metal extension portion 536 thus exports the source electrode. Further a first laminated extending structure comprising a plurality of conductive layer 535a interconnected by vias 535b is set above and electrically connected with the drain metal extension portion 535 so as to export the drain of the first transistor. A second laminated extending structure comprising a plurality of conductive layer 536a interconnected by vias 536b is set above and electrically connected with the source metal extension portion 536 so as to export the source of the second transistor.

As shown in FIG. 5B-5E, the first gate metal layer 521, the drain metal layer 531, the source metal layer 532 and the second gate metal layer 522 are separated from each other via separation area, and the separation area is filled with dielectric media; any layer in which the capacitor plate lies shall contain the insulating separation area for insulating against and separating the device structures without mutual electrical connection in this layer (such as the capacitor plate, the first laminated extending structure and the second laminated extending structure), and the separation area is filled with dielectric media.

To get the maximized capacitor, the quantity of the layers of the type-one capacitor plates 540 and the type-two capacitor plates 550 in Embodiment 4 may be that other than the quantity in FIGS. 5A-1, 5A-2 and 5B-5E, and the number of the corresponding first laminated gate metal layer 521a, second laminated gate metal layer 522a, the first laminated extending structure 535a and second laminated extending structure 536a can be also the quantity other than that shown in FIGS. 5A-1, 5A-2 and 5B-5E.

Embodiment 5

Figures 1, 6A:
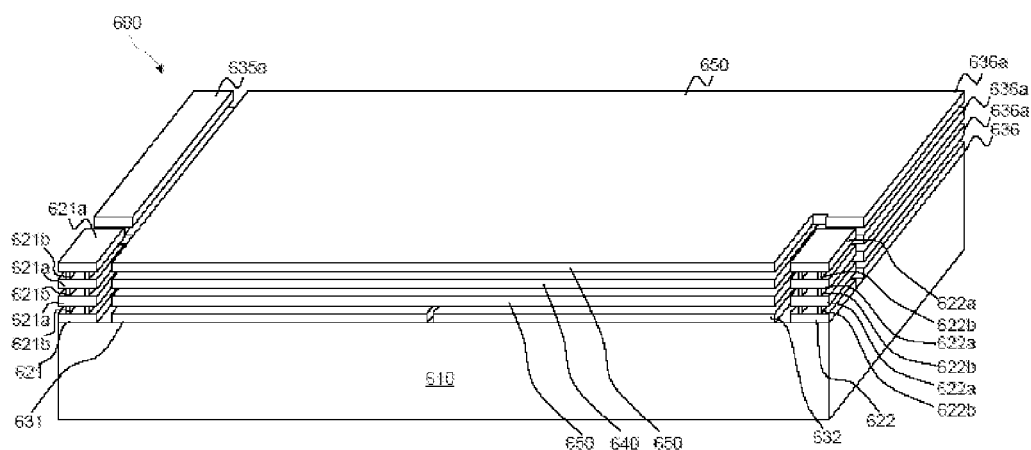
Figures 2, 6A:
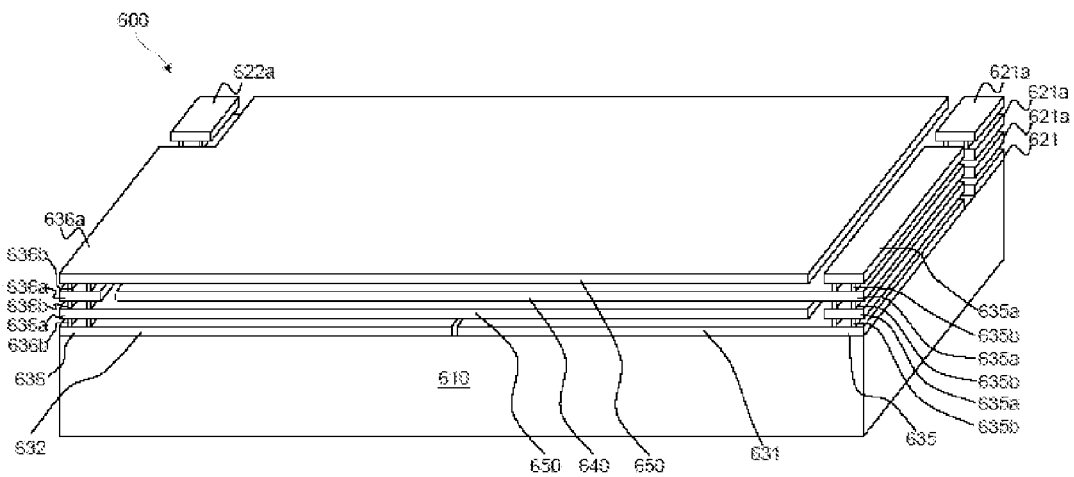
Figure 6B:
FIG. 6B is a plan view of the electrodes on top of the silicon die substrate corresponding to the perspective view in Embodiment 5 of the present invention.
Figure 6C:
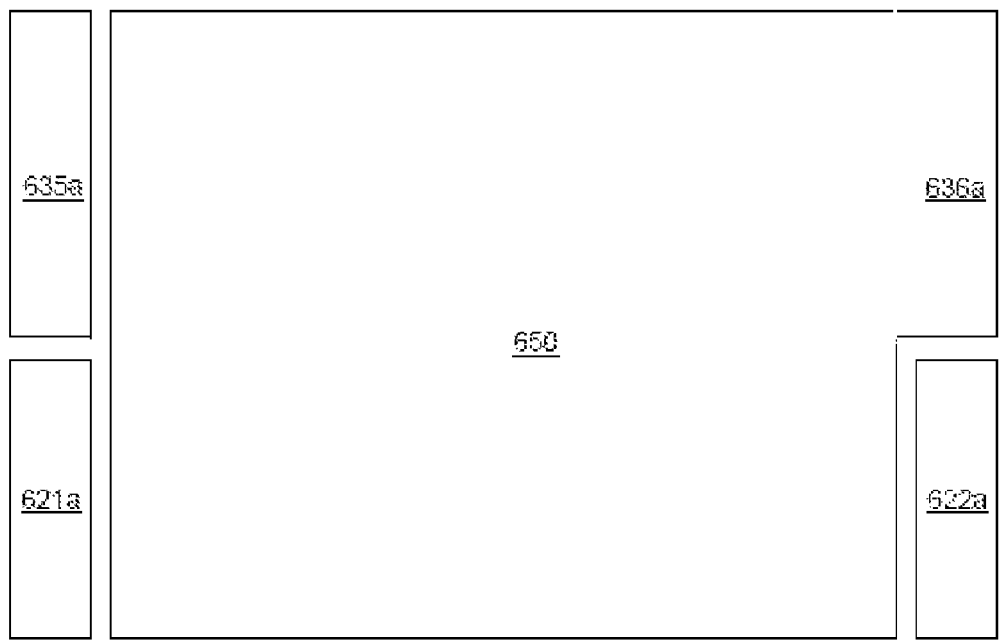
FIG. 6C-6E are the plan views of each layer of capacitor plates corresponding to the perspective view in Embodiment 5 of the present invention.
Figure 6D:
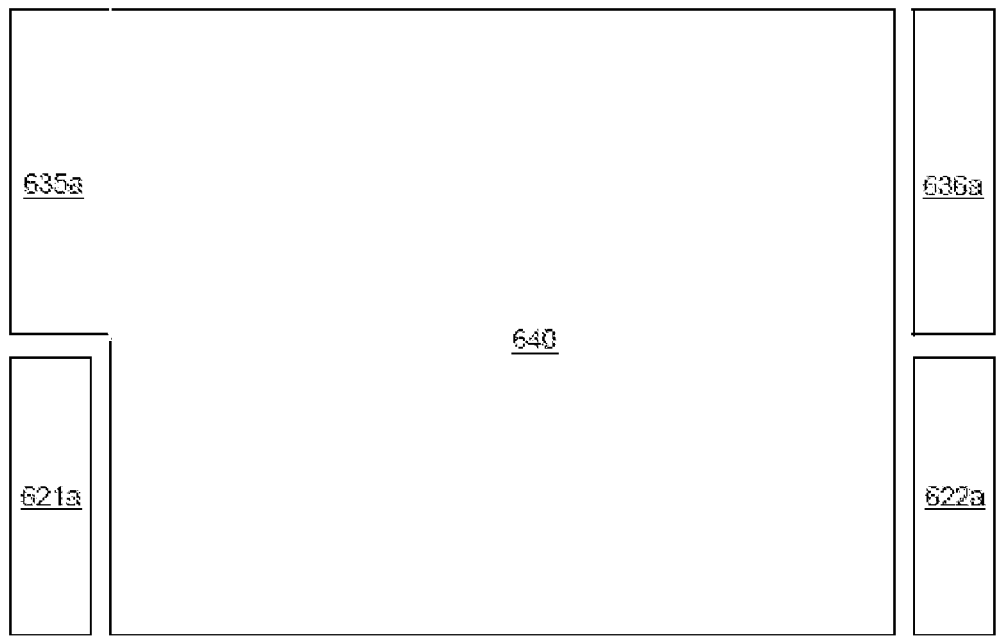
Figure 6E:
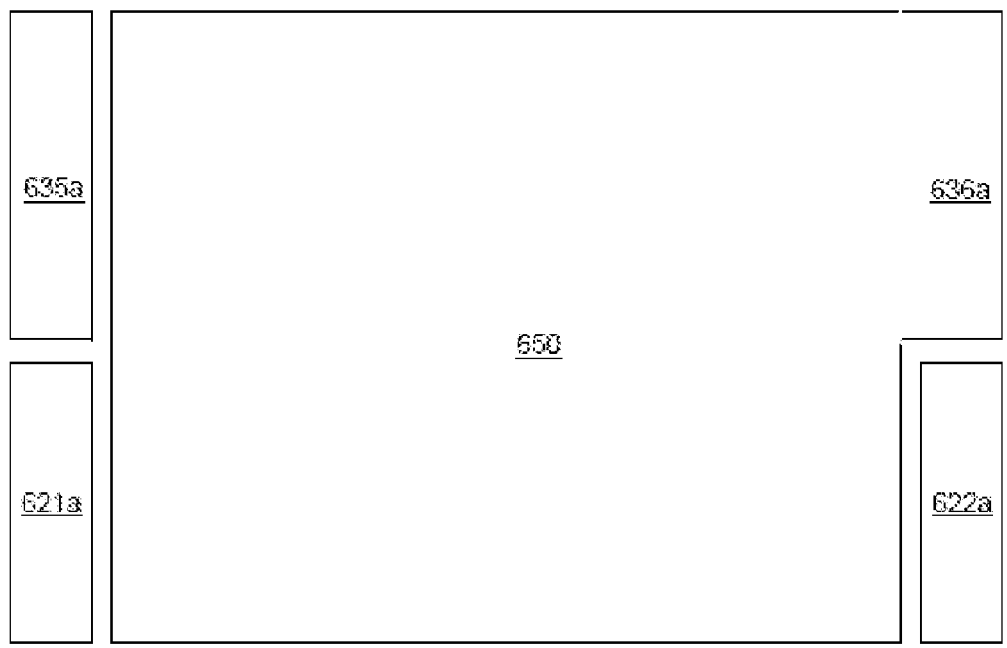

In Embodiment 4 the type-one and type-two connection portions are separated from the drain extending structure and the source extending structure. Embodiment 5 discloses an alternative where the type-one and type-two connection structures are furnished by the laminated drain extending structure and the laminated source extending structure respectively. As shown in FIGS. 6A-1 (a perspective view of the front side of the structure 600), 6A-2 (a perspective view of the back side of the structure 600), and 6B-6E (top views of each layer of capacitor plate stacking over the top surface of the MOSFET corresponding to the perspective views of Embodiment 5 structure), a bypass capacitor is integrated onto a semiconductor chip comprising a high side MOSFET and a low side MOSFET integrated on silicon substrate 610.

The high side and low side dual MOSFET chip is the same as that in Embodiment 4. A first gate metal layer 621 forming the gate electrode of the first transistor, a drain metal layer 631 forming the drain electrode of the first transistor, a second gate metal layer 622 forming the gate electrode of the second transistor and a source metal layer 632 forming the source electrode of the second transistor are set on the top of the silicon die substrate 610. The first transistor is a high side MOSFET, and the second transistor is a low side MOSFET.

A multi-layer capacitor plate containing a plurality of type-one capacitor plates 640 and a plurality of type-two capacitor plates 650 parallel to the silicon die substrate 610 are set above the top of the silicon die substrate 610, and dielectric layers (not shown in the figure) fill between the neighboring conductive layers.

The type-one capacitor plates 640 and the type-two capacitor plates 650 are alternatively configured at intervals; moreover, the type-one capacitor plates 640 are electrically connected with the drain metal layer 631 to form one electrode of the bypass capacitor, the type-two capacitor plates 650 are electrically connected with the source metal layer 632 to form the other electrode of the bypass capacitor.

A first laminated gate pad comprising a plurality of conductive layer 621a interconnected by vias 621b set above first gate metal layer 621 is electrically connected with the first gate metal layer 621 so as to export the gate of the first transistor.

A second laminated gate pad comprising a plurality of conductive layer 622a interconnected by vias 622b set above second gate metal layer 622 is electrically connected with the second gate metal layer 622 so as to export the gate of the second transistor.

As shown in FIGS. 6A-1, 6A-2 and 6B-6E a first laminated extending structure comprising a plurality of conductive layer 635a interconnected by vias 635b is electrically connected with the drain metal extension portion 635 so as to export the drain of the first transistor. A second laminated extending structure comprising a plurality of conductive layer 636a interconnected by vias 636b is electrically connected with the source metal extension portion 636 so as to export the source of the second transistor. Further as shown in FIGS. 6B-6E, each type-one capacitor plate 640 extends to a corresponding first extending structure layer 635a thus electrically connecting to the drain metal 631 and each type-two capacitor plate 650 extends to a corresponding second extending structure layer 636a thus electrically connecting to the source metal 632. As shown in FIG. 6B-6E, the first gate metal layer 621, the drain metal layer 631, the source metal layer 632 and the second gate metal layer 622 are separated from each other via the separation area, and the separation area is filled with dielectric media; any layer in which the capacitor plate lies shall contain the insulating separation area for insulating against and separating the device structures without mutual electrical connection in this layer (such as the capacitor plate, the first laminated extending structure, the second laminated extending structure, the first laminated gate metal layer, the second laminated gate metal layer), and the separation area is filled with the dielectric media.

To get the maximized capacitor, the quantity of the layers of the type-one capacitor plates 640 and the type-two capacitor plates 650 in Embodiment 5 may be that other than the quantity in FIGS. 6A-1, 6A-2 and 6B-6E, and the number of the corresponding first laminated gate metal layer 621*a*, second laminated gate metal layer 622*a*, first laminated extending structure 635*a* and second laminated extending structure 636*a* can be also a quantity other than that shown in FIGS. 6A-1, 6A-2 and 6B-6E.

The invention provides the obvious advantages of integrating the bypass capacitor onto the MOSFET so as to eliminate parasitic effect due to wire connections between discrete components such as interconnection discrete inductance and minimizing the component and circuit package space. Further the integration of capacitor on top of the semiconductor chip helps to improve the mechanical strength of the silicon die substrate thus allowing the silicon die substrate to be grinded thinner so as to reduce the resistance of the MOSFET therefore improve the efficiency.

The technical solution disclosed by the abovementioned embodiments may have changes without deviating from the spirit of the present invention, for example: increase or decrease of the metal layers and dielectric layers, different modes of adjusting and exporting the gate and source, or the change of chip type. These changes are all undoubtedly considered as the component of the present invention by the inventor.

The Specification and the Drawings show the typical embodiments of the specific structure in detail. Although the present invention set forth these preferred embodiments, these contents shall not be considered as the restriction to the invention. Many other variations and modification can be applied to these embodiments without additional unnecessary experiments by the ordinal skill in the art. For instance, the present invention uses MOSFET transistors as examples for illustration. However, the same invention concept is also applicable to bipolar transistors. Therefore, the claims attached shall be considered as the contents including all changes and modifications within the real intention and scope of the present invention. Any and all equivalent scopes and contents within the claims shall be within the intention and scope of the present invention.

The invention claimed is:

1. A method for integrating a capacitor onto a power semiconductor device comprising the steps:
   a. providing a first power transistor disposed on a semiconductor chip, wherein the first power transistor having a first metal electrode and a second metal electrode disposed on a top surface of the semiconductor chip;
   b. depositing a dielectric layer overlaying the first metal electrode and the second metal electrode, forming a plurality of conducting vias through the dielectric layer on top of the first metal electrode and the second metal electrode;
   c. depositing a conductive layer overlaying the dielectric layer, said conductive layer electrically connecting to the first and second metal electrodes through the conducting vias;
   d. patterning the conductive layer to form a capacitor plate above the first metal electrode and a second electrode extending structure above the second metal electrode;
   e. repeating steps b to d until a predetermined number of capacitor plate layers being provided.

2. The method for integrating a capacitor onto a power semiconductor device of claim 1, wherein the first metal electrode further comprising an extension portion and step b further providing a plurality of conducting vias through the dielectric layer on top of the first metal electrode extension portion.

3. The method for integrating a capacitor onto a power semiconductor device of claim 2, wherein step d further patterning the conductive layer to form a first metal electrode extending structure on top of the first metal electrode extension portion and separated from the capacitor plate.

4. The method for integrating a capacitor onto a power semiconductor device of claim 2, wherein step d further patterning the conductive layer to form a capacitor connecting plate separated from the capacitor plate.

5. The method for integrating a capacitor onto a power semiconductor device of claim 4, wherein the capacitor plate extending to a region above the first metal electrode extending structure.

6. The method for integrating a capacitor onto a power semiconductor device of claim 4, wherein step b further providing a plurality of conducting vias through the dielectric layer below the capacitor connecting plate.

7. The method for integrating a capacitor onto a power semiconductor device of claim 6, wherein the capacitor plate electrically isolated from the first metal electrode.

8. The method for integrating a capacitor onto a power semiconductor device of claim 7, wherein the capacitor connecting plate electrically connecting to the first metal electrode.

9. The method for integrating a capacitor onto a power semiconductor device of claim 6, wherein the capacitor connecting plate being electrically isolated from the first metal electrode.

10. The method for integrating a capacitor onto a power semiconductor device of claim 9, wherein the capacitor plate being electrically connecting to the first metal electrode.

11. The method for integrating a capacitor onto a power semiconductor device of claim 1 wherein step a further providing a second power transistor disposed on the semiconductor chip.

12. A method for integrating a capacitor onto a power semiconductor device comprising the steps:
   a. providing a first power transistor and a second power transistor disposed on a semiconductor chip, wherein the first power transistor having a first metal electrode and a second metal electrode disposed on a top surface of the semiconductor chip and wherein the second power transistor having a third metal electrode and a fourth metal electrode disposed on the top surface of the semiconductor chip;
   b. depositing a dielectric layer overlaying the top surface, forming a plurality of conducting vias through the dielectric layer on top of the first metal electrode and the second metal electrode;

c. depositing a conductive layer overlaying the dielectric layer, said conductive layer electrically connecting to the first and second metal electrodes through the conducting vias;

d. patterning the conductive layer to form a capacitor plate above the first metal electrode and a second electrode extending structure above the second metal electrode;

e. repeating steps b to d until a predetermined number of capacitor plate layers being provided.

13. The method for integrating a capacitor onto a power semiconductor device of claim 12, wherein step b further forming a plurality of conducting vias through the dielectric layer on top of the third metal electrode and the fourth metal electrode.

14. The method for integrating a capacitor onto a power semiconductor device of claim 12, wherein step c further providing said conductive layer electrically connecting to the third and fourth metal electrodes through the conducting vias.

15. The method for integrating a capacitor onto a power semiconductor device of claim 12, wherein step d further patterning the conductive layer to form a fourth electrode extending structure above the fourth metal electrode.

16. The method for integrating a capacitor onto a power semiconductor device of claim 15, wherein step d further patterning the conductive layer to form the capacitor plate extending above the first metal electrode and the third metal electrode.

17. The method for integrating a capacitor onto a power semiconductor device of claim 16, wherein the first and third metal electrodes each further comprising an extension portion and step b further providing a plurality of conducting vias through the dielectric layer on top of the first and third metal electrode extension portions.

18. The method for integrating a capacitor onto a power semiconductor device of claim 17, wherein step d further patterning the conductive layer to form a first metal electrode extending structure on top of the first metal electrode extension portion and separated from the capacitor plate.

19. The method for integrating a capacitor onto a power semiconductor device of claim 18, wherein the capacitor plate extending to a region above the third metal electrode extending structure.

20. The method for integrating a capacitor onto a power semiconductor device of claim 17, wherein step d further patterning the conductive layer to form a third metal electrode extending structure on top of the third metal electrode extension portion and separated from the capacitor plate.

21. The method for integrating a capacitor onto a power semiconductor device of claim 20, wherein the capacitor plate extending to a region above the first metal electrode extending structure.

22. The method for integrating a capacitor onto a power semiconductor device of claim 21, wherein the first power transistor is a MOSFET, the first metal electrode is a source electrode and the second electrode is gate electrode.

23. The method for integrating a capacitor onto a power semiconductor device of claim 22, wherein the second power transistor is a MOSFET, the third metal electrode is a drain electrode and the fourth electrode is gate electrode.

* * * * *